United States Patent
Gibson et al.

(10) Patent No.: US 9,263,397 B2
(45) Date of Patent: Feb. 16, 2016

(54) WAFER MAPPING PROCESS CONTROL WITH INDICATOR LINE

(71) Applicant: Microchip Technology Incorporated, Chandler, AZ (US)

(72) Inventors: Matthew Gibson, Chandler, AZ (US); Prem Na-Namchiew, Bangkok (TH); Ekgachai Kenganantanon, Muangchacherngsao Chacherngsao (TH); Mathew Bunker, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/197,625

(22) Filed: Mar. 5, 2014

(65) Prior Publication Data

US 2014/0264962 A1   Sep. 18, 2014

Related U.S. Application Data

(60) Provisional application No. 61/777,638, filed on Mar. 12, 2013.

(51) Int. Cl.
| | |
|---|---|
| *H01L 21/20* | (2006.01) |
| *H01L 21/36* | (2006.01) |
| *H01L 23/544* | (2006.01) |
| *H01L 21/67* | (2006.01) |
| *H01L 21/68* | (2006.01) |

(52) U.S. Cl.
CPC ........ *H01L 23/544* (2013.01); *H01L 21/67132* (2013.01); *H01L 21/67259* (2013.01); *H01L 21/68* (2013.01); *H01L 2924/0002* (2013.01)

(58) Field of Classification Search
CPC ................. H01L 21/67259; H01L 23/544
USPC ................................ 414/800; 438/482
See application file for complete search history.

(56) References Cited

U.S. PATENT DOCUMENTS

| | | | |
|---|---|---|---|
| 2004/0029306 A1 | 2/2004 | Subramanian et al. | 438/33 |
| 2014/0002128 A1* | 1/2014 | Ohmart et al. | 324/762.03 |

FOREIGN PATENT DOCUMENTS

| | | | | |
|---|---|---|---|---|
| JP | 632344 A | 1/1988 | ............. | G01B 11/00 |
| JP | 2001068529 A | 3/2001 | ............. | H01L 21/67 |
| JP | 2001068529 A * | 3/2001 | ............. | H01L 21/68 |
| JP | 2013004794 A | 1/2013 | ............. | H01L 21/301 |
| JP | 2013004794 A * | 1/2013 | ............. | H01L 21/301 |

OTHER PUBLICATIONS

International Search Report and Written Opinion, Application No. PCT/US2014/021179, 8 pages, Apr. 29, 2014.

* cited by examiner

*Primary Examiner* — David S Blum
(74) *Attorney, Agent, or Firm* — Slayden Grubert Beard PLLC

(57) ABSTRACT

A method for providing alignment in a die picking process may include aligning a semiconductor wafer based on a reference die, forming an indicator line relative to the reference die by picking a number of dice along a line extending across the wafer, and using the reference line to monitor a position of the picking machine relative to the wafer. A die attach machine may include a control system for automatically implementing such method.

14 Claims, 17 Drawing Sheets

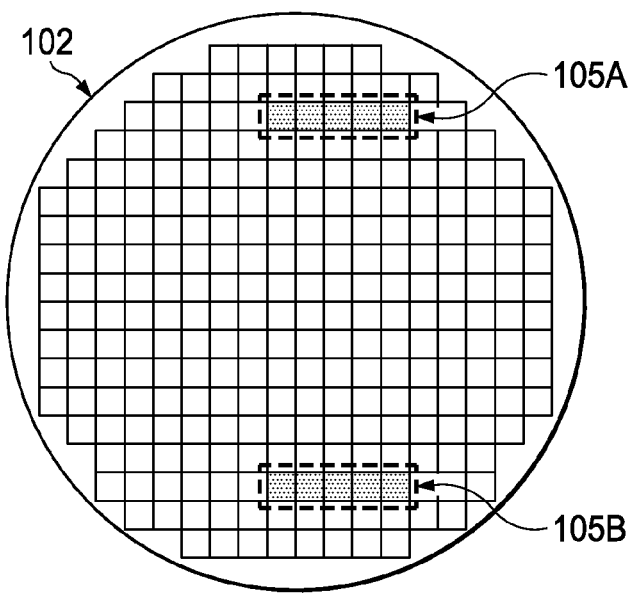
FIG. 2A1
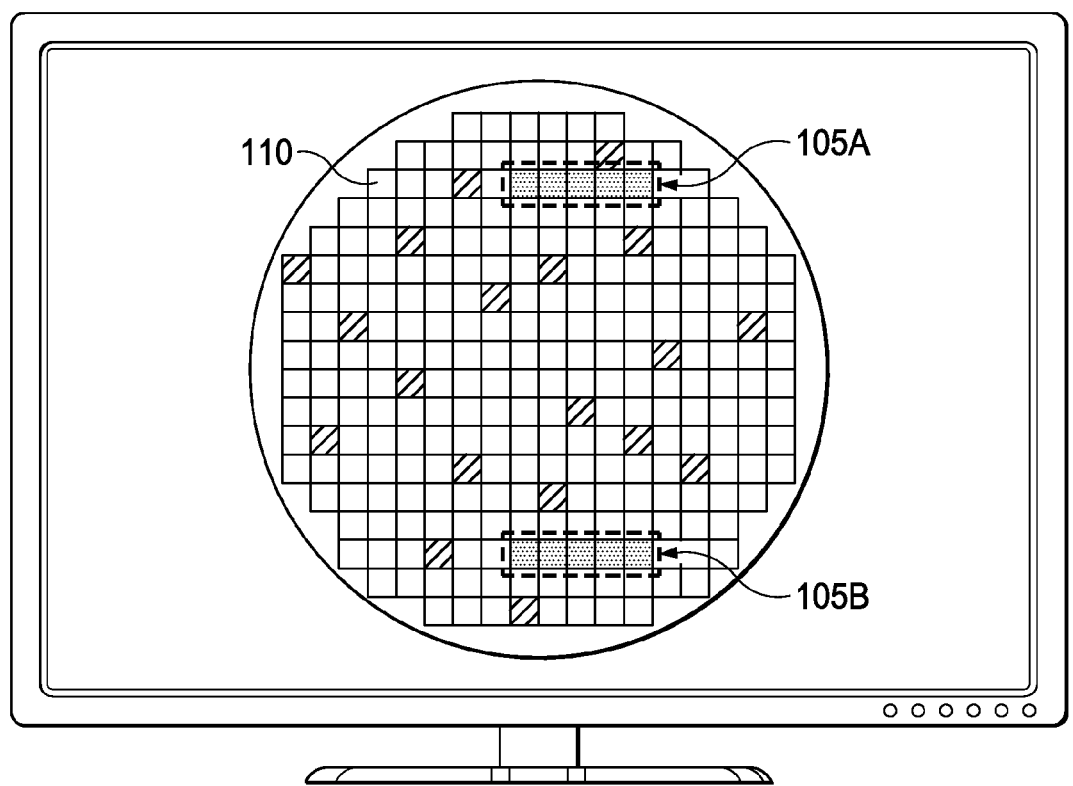
FIG. 2A2

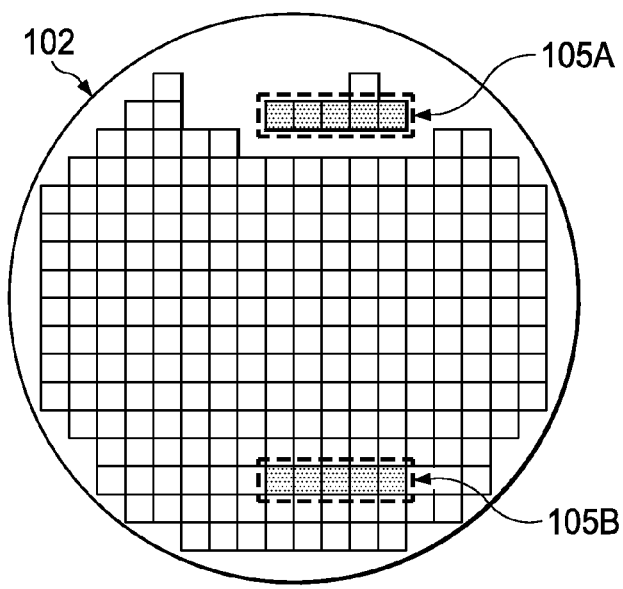
FIG. 2B1
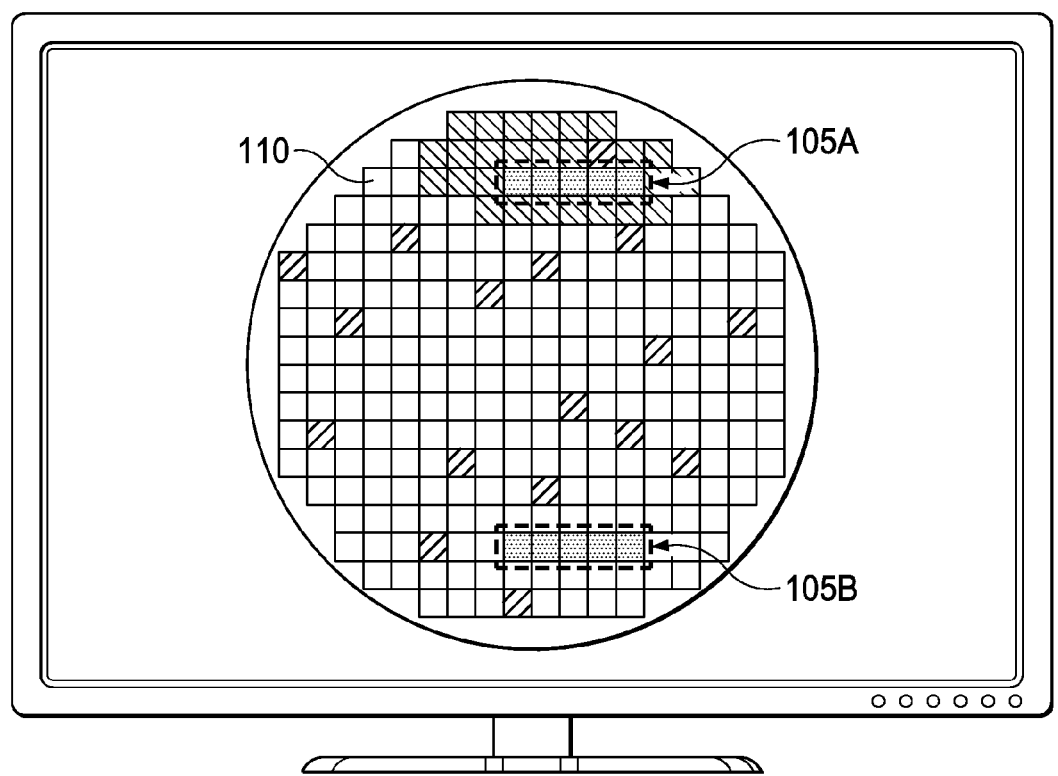
FIG. 2B2

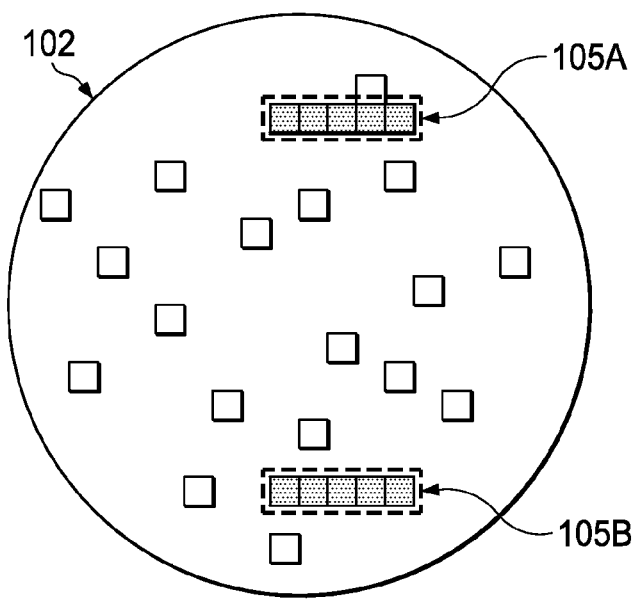
FIG. 2C1
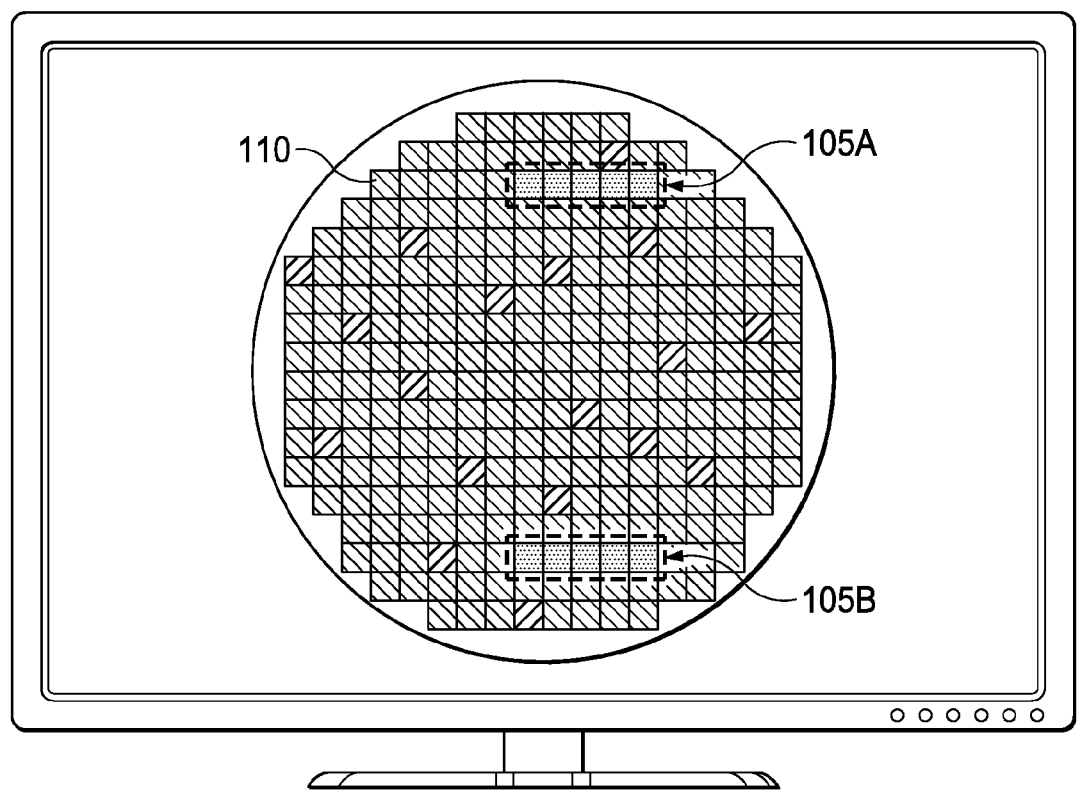
FIG. 2C2

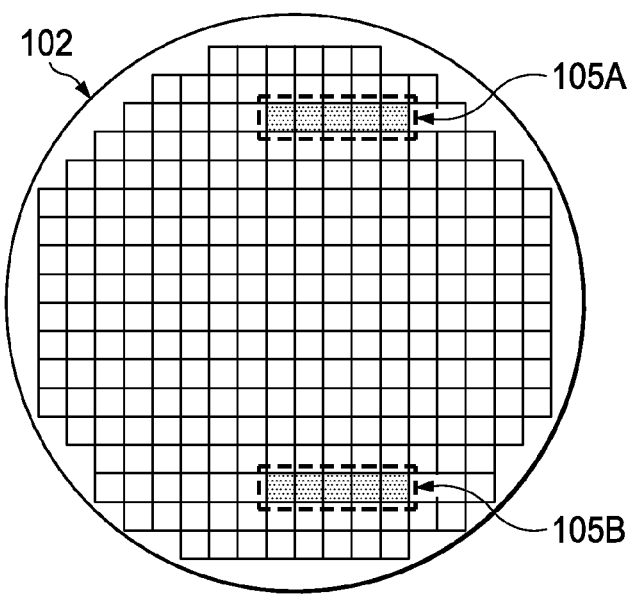
FIG. 3A1
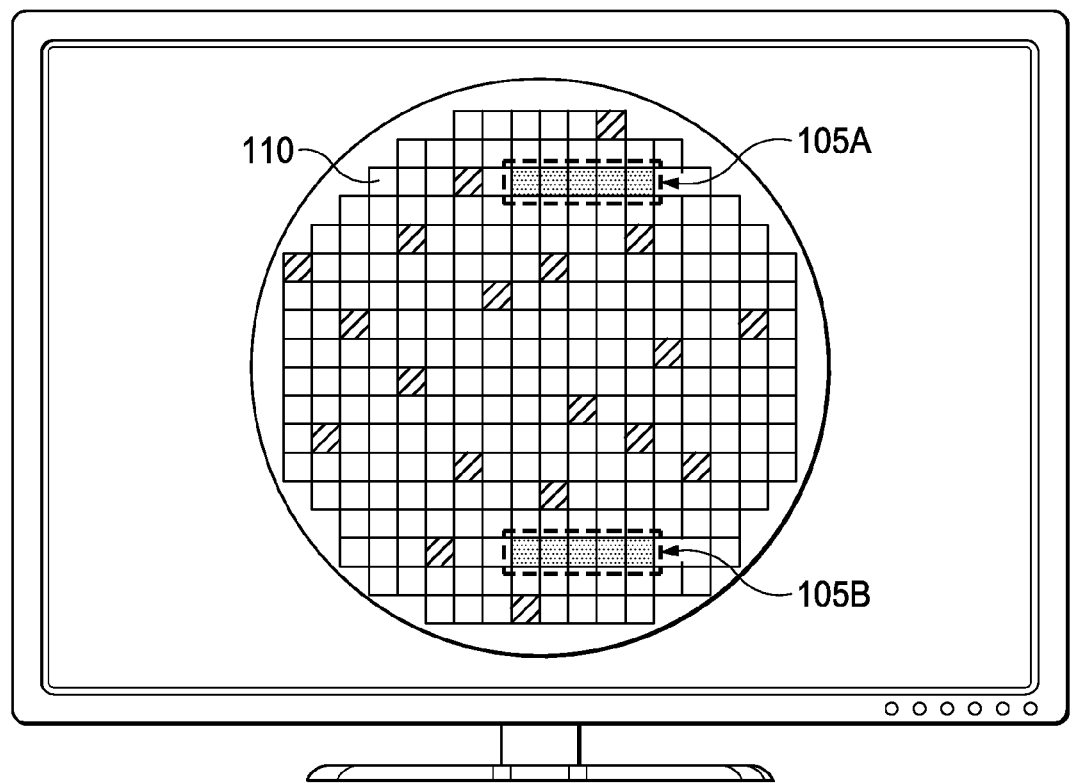
FIG. 3A2

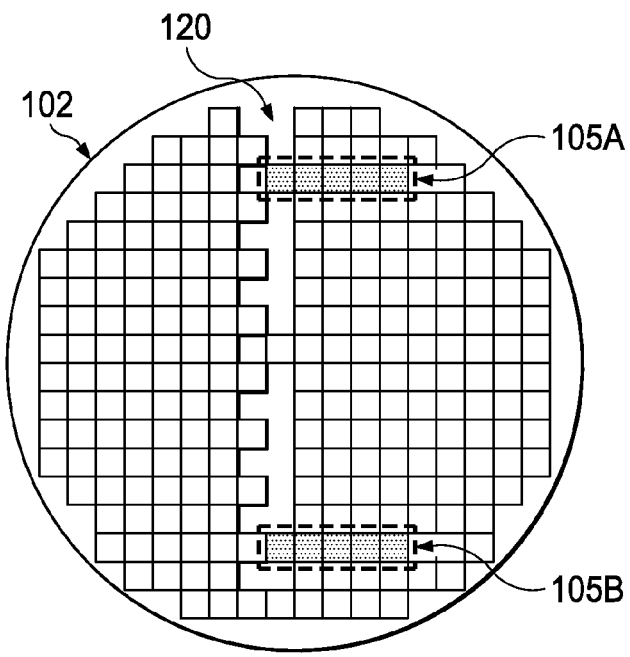
FIG. 3B1
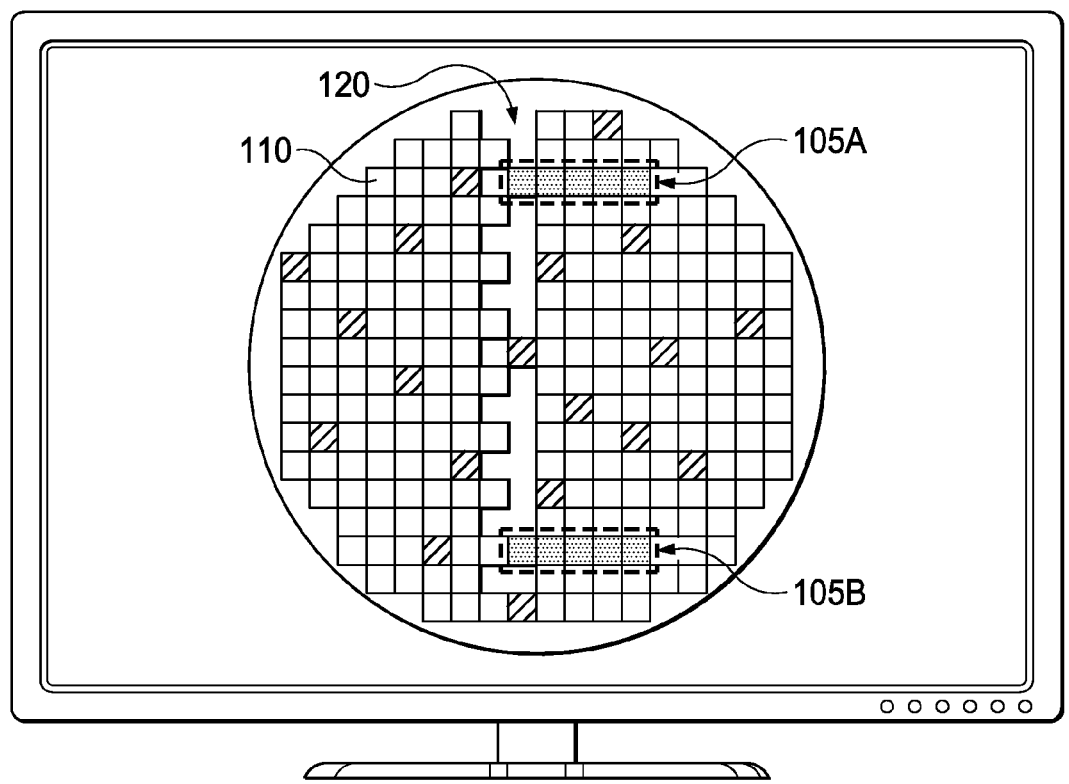
FIG. 3B2

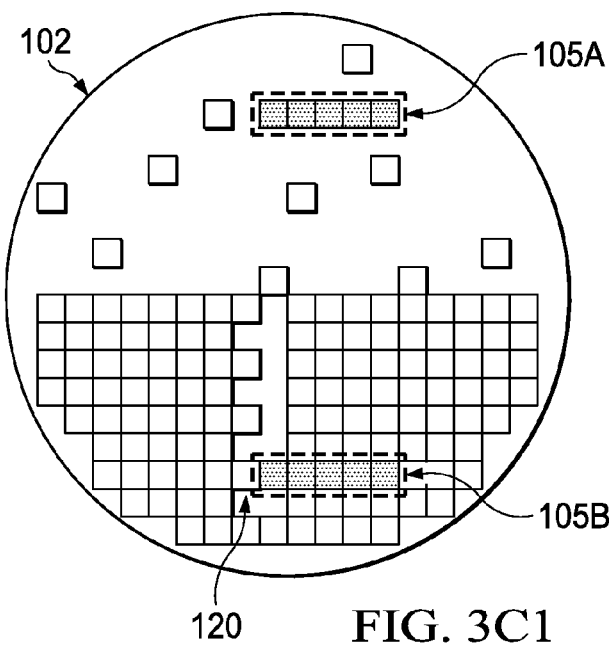
FIG. 3C1
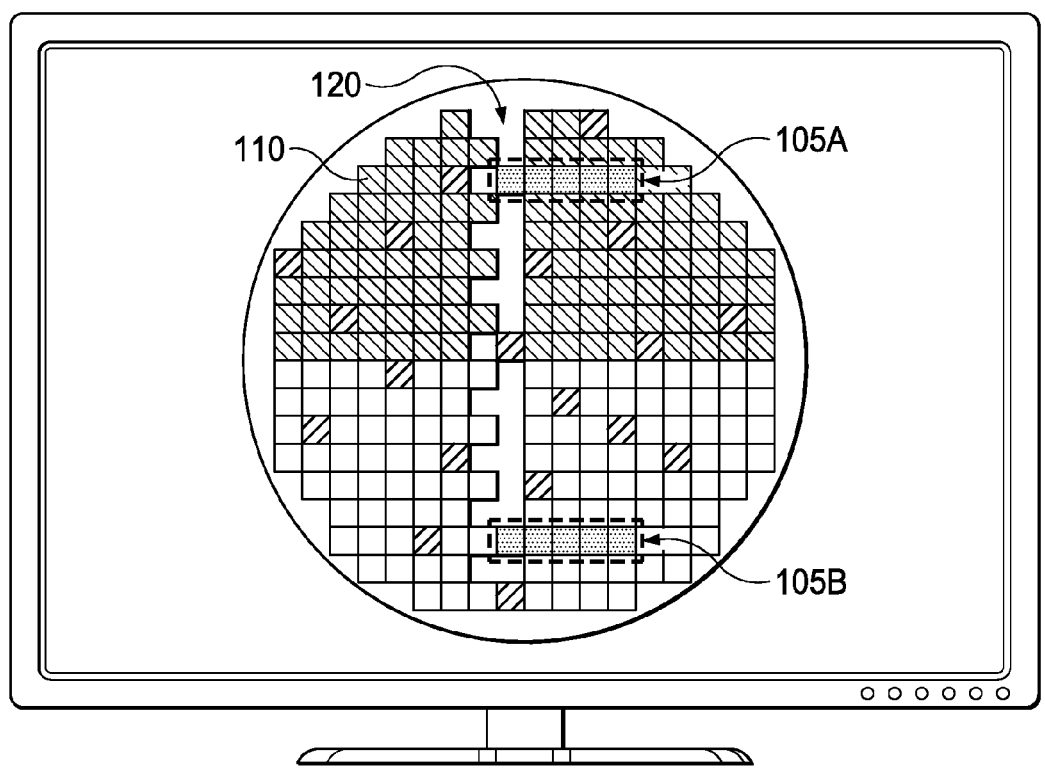
FIG. 3C2

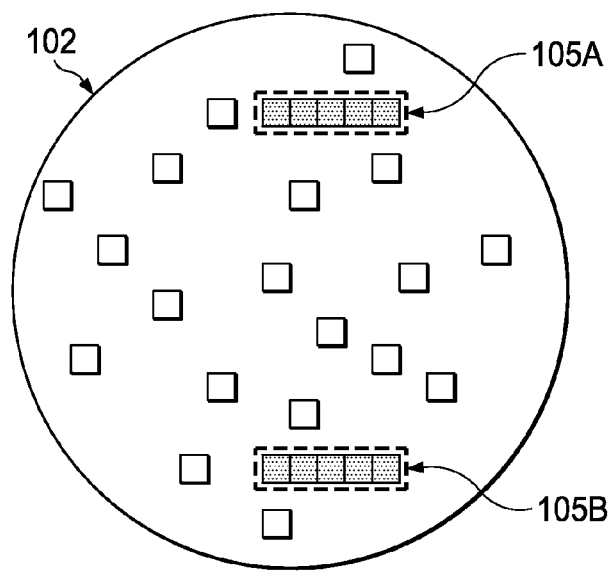
FIG. 3D1
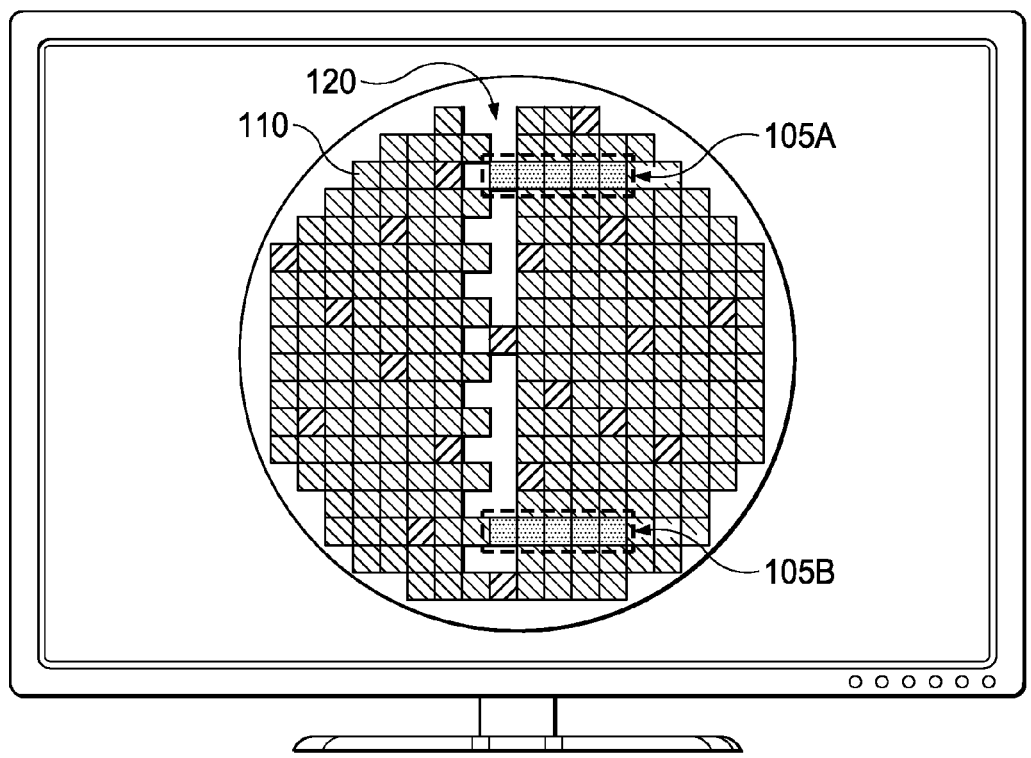
FIG. 3D2

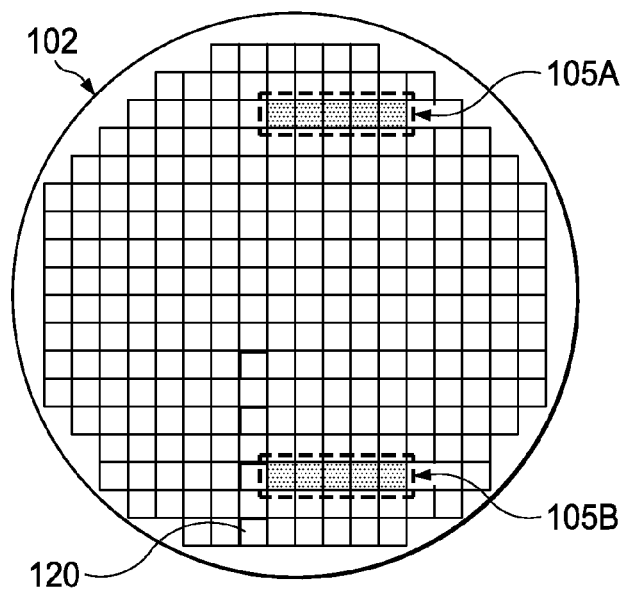
FIG. 4A1
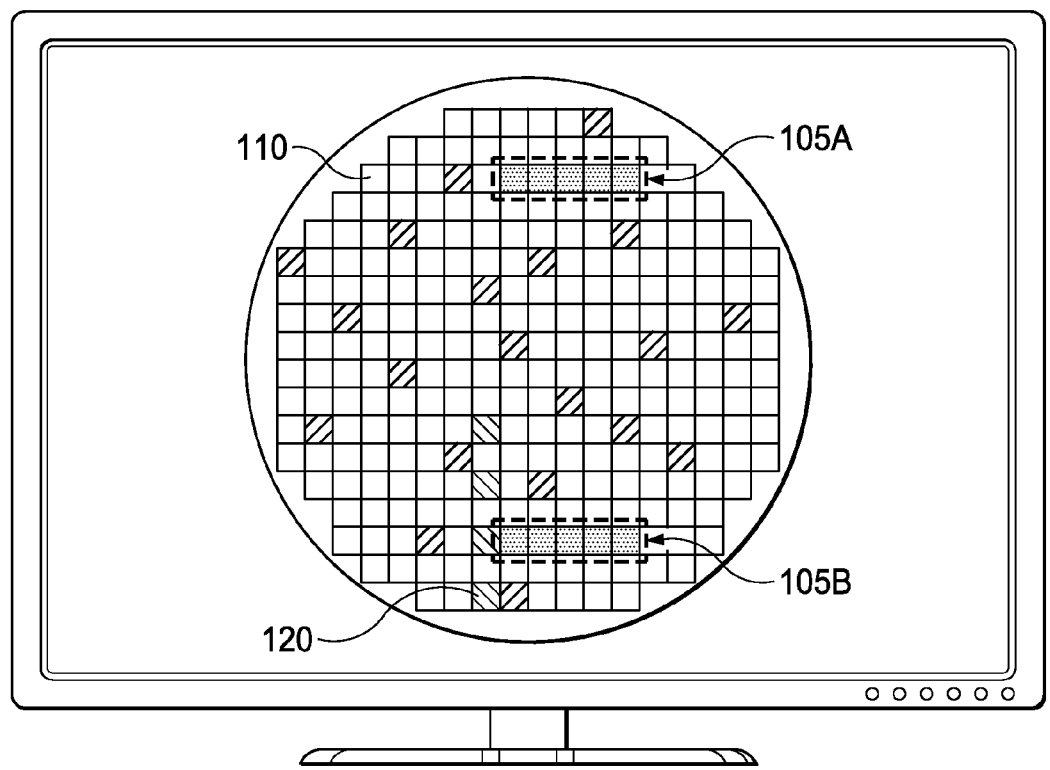
FIG. 4A2

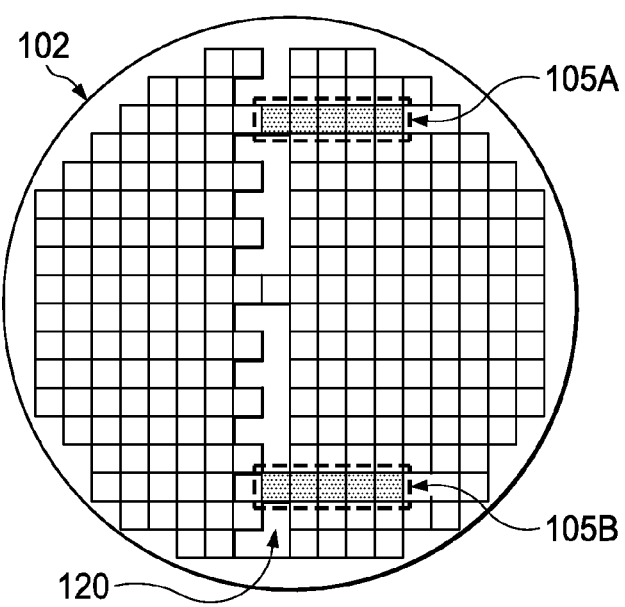
FIG. 4B1
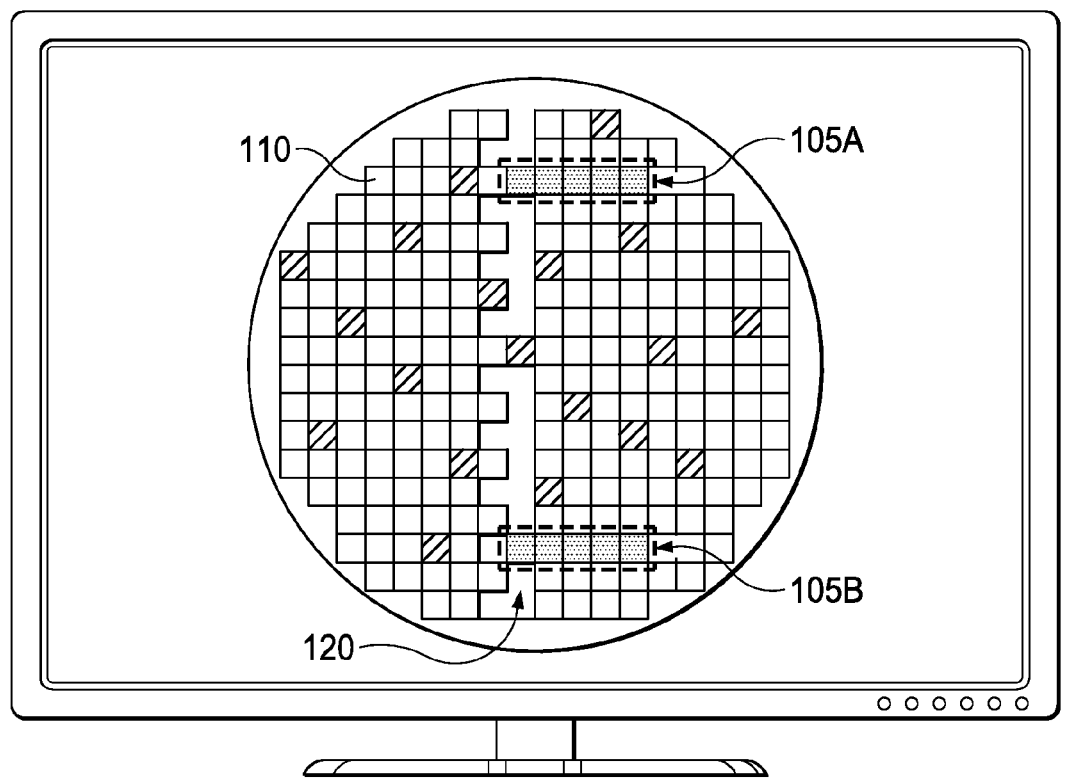
FIG. 4B2

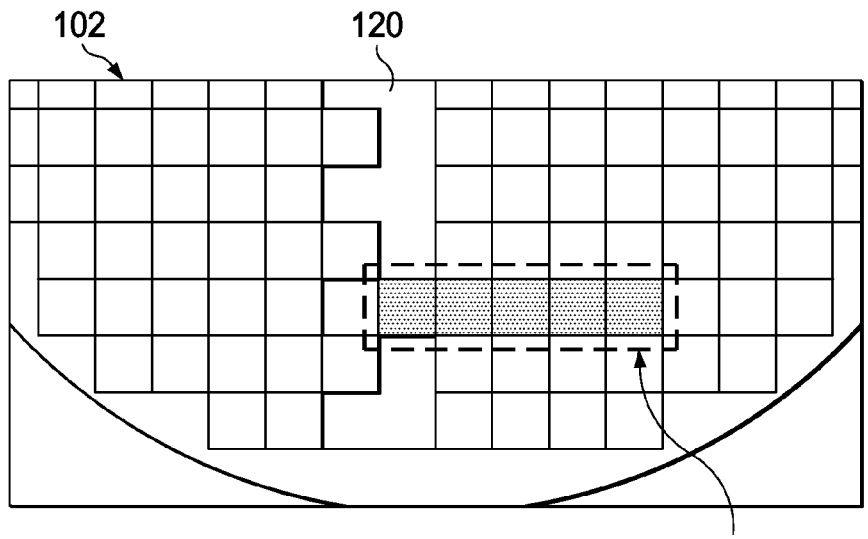
FIG. 4C1
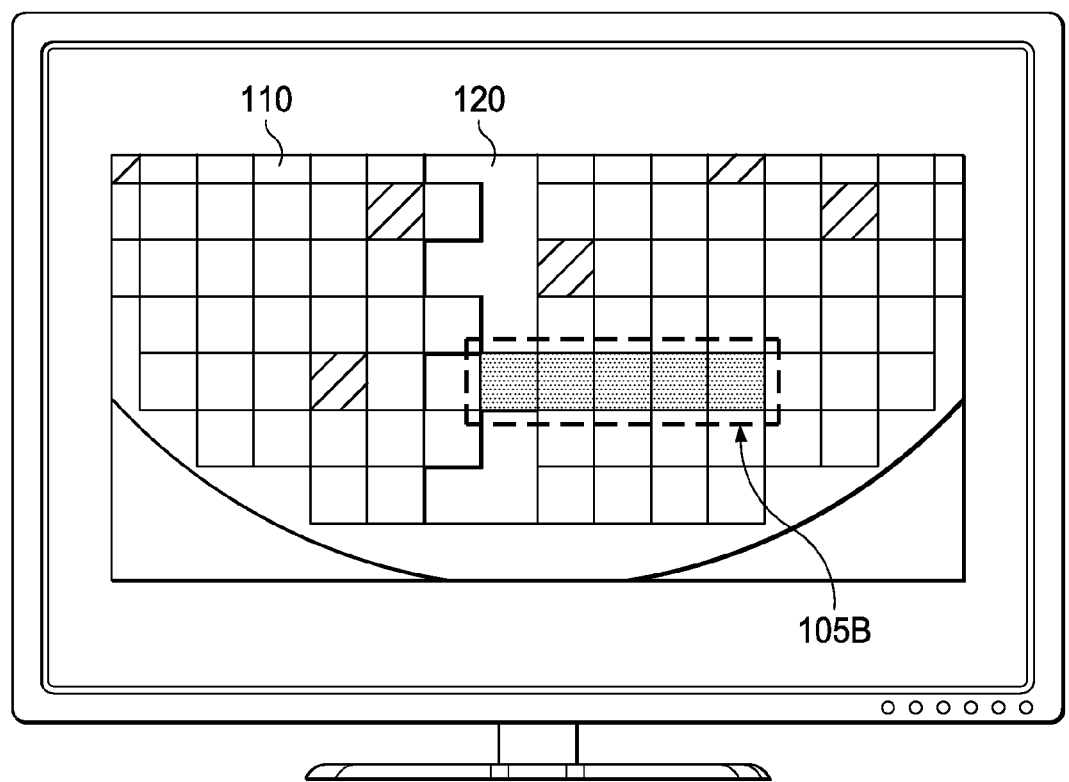
FIG. 4C2

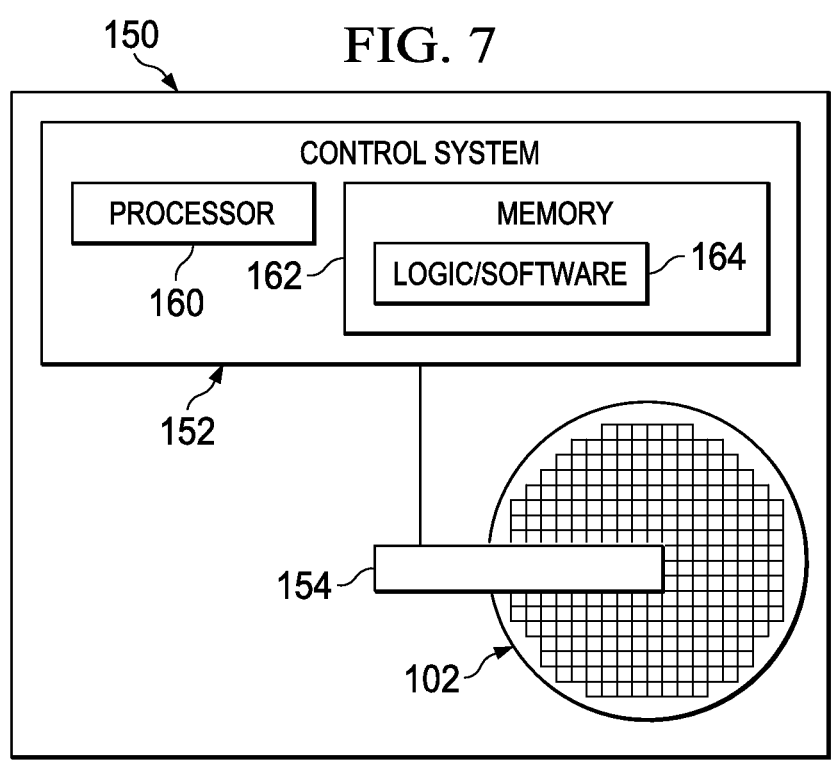

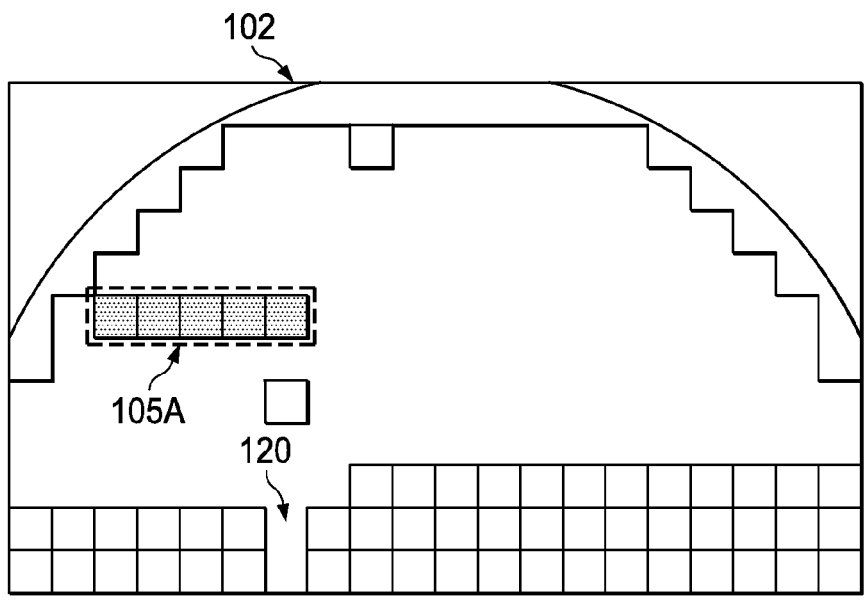
FIG. 9A1
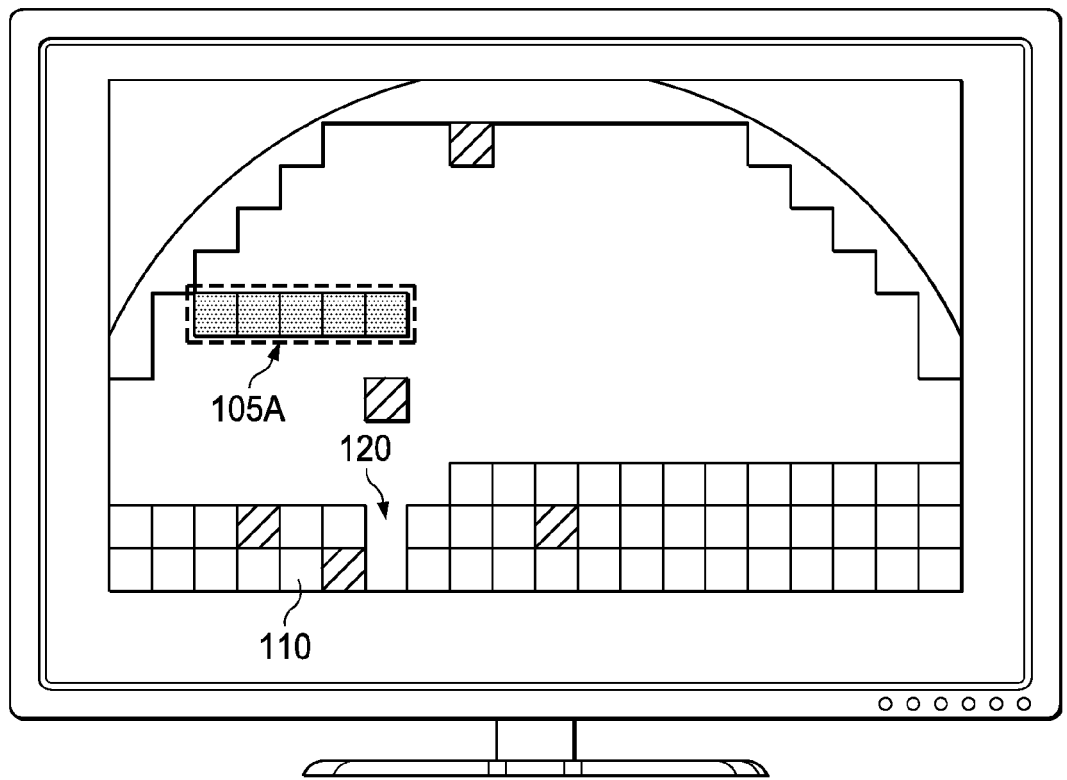
FIG. 9A2

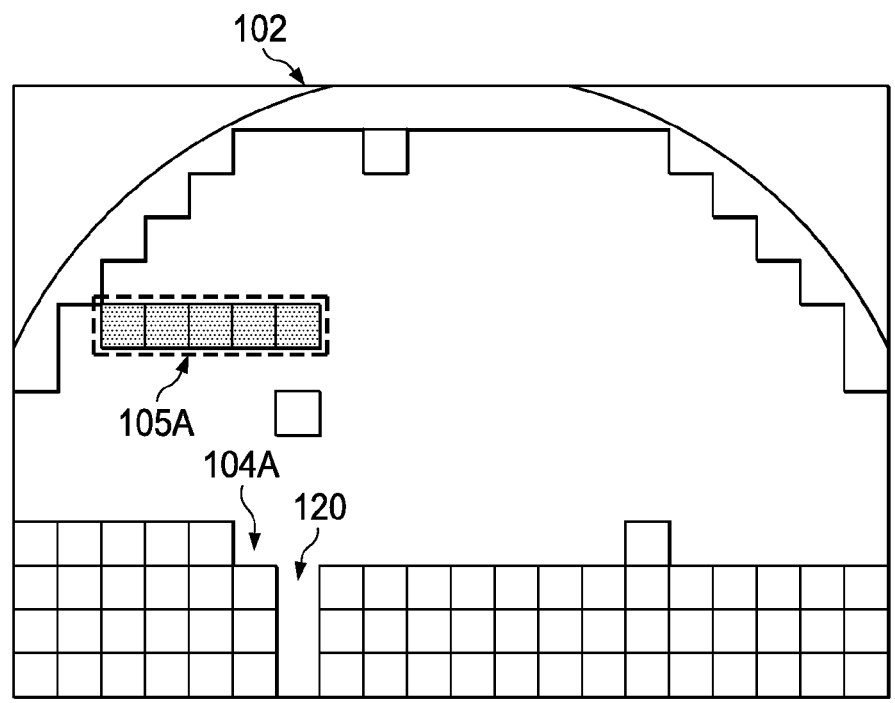
FIG. 9B1
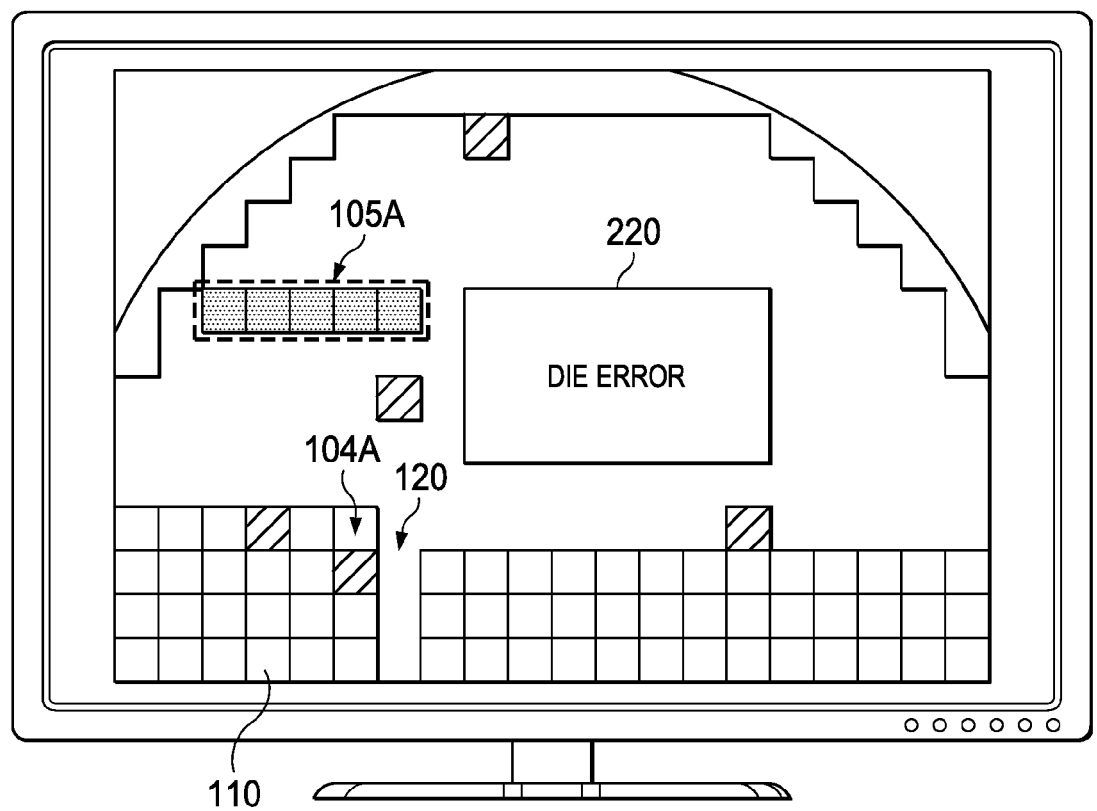
FIG. 9B2

WAFER MAPPING PROCESS CONTROL WITH INDICATOR LINE

CROSS-REFERENCE TO RELATED APPLICATIONS

This application claims the benefit of U.S. Provisional Application No. 61/777,638 filed on Mar. 12, 2013, which is incorporated herein in its entirety

TECHNICAL FIELD

The present disclosure relates to semiconductor chip processing, e.g., a wafer mapping process that provides reliable and accurate picking of dice from a wafer.

BACKGROUND

Wafers are typically diced on adhesive tape or plastic foil so the dice are contained, but easily removable, e.g., for storage in waffle packs, gel pack, tape and reel, or bonding into a package. Individual dice may be removed in various manners, e.g., gripping the die and pulling it from the tape, pushing the die from the tape with a pin, or drawing the tape away from the die by vacuum. The released die is generally picked by a vacuum tool and placed as desired. Some systems include a pick and place machine and die bonder equipped with an ejector needle system that pushes against the die back side to help break the adhesion force of the adhesive foil, and a vacuum pick-up tool with coordinated z-axis movement that holds the die before transfer to bond position.

The picking of dice from the wafer is typically facilitated using a wafer map indicating the positions of the various dice on the wafer. In a conventional process, one or more reference dice are used to align the pick position, i.e., the position of the picking tool, e.g., die attach (D/A) machine, relative to the wafer or particular die.

FIG. 1 shows a schematic plan view diagram of a semiconductor integrated circuit wafer comprising a plurality of semiconductor dice. A silicon wafer 102 may be scribed into a plurality of semiconductor dice 104 for further processing to create planar transistors, diodes and conductors on each of the plurality of semiconductor dice 104. After all circuits have been fabricated on the plurality of semiconductor dice 104, the dice 104 are singulated (separated) and packaged into integrated circuits (not shown).

FIGS. 2A1-2C2 illustrate a conventional picking process using a reference die for alignment. In particular, FIGS. 2A1-2C2 illustrate a physical wafer 102 and a corresponding wafer map 110 for three steps of the process. The wafer 102 may be pre-fabricated with one or more reference dice, which may be arranged in groups. In this example, wafer 102 is pre-fabricated with two groups of reference dice: an upper reference die group 105A and a lower reference die group 105B, each including the same number of dice (in this example, five dice) aligned in a row. In a first step, with reference to FIGS. 2A1 and 2A2, user may select one of the reference die groups (reference die group 105A or reference die group 105B) to act as a spatial reference for subsequent die picking. The individual die 104 on each end of the selected reference die group 105A or 105B (in the illustrated example, the left-most die 104 and right-most die 104 of the selected reference die group 105A or 105B) may be visually marked by the software, e.g., by adding a "+" or other symbol over such dice 104 on the wafer map 110. As used herein, the selected reference die group (here, either group 105A or 105B) is also simply referred to as the reference die 105.

In a second step, illustrated by FIGS. 2B1 and 2B2, a picking/die attach machine begins picking up dice 104 from any position on the wafer 102, while using the selected reference die 105 to check the relative positioning of the picking machine and wafer 102. The picking process may continue until all or substantially all dice 104 on the wafer 102 are consumed, as shown in FIGS. 2C1 and 2C2.

However, the selected reference die 105 typically provides only two points (the individual dice 104 at each end of the reference die 105) in the wafer 102 such that the picking tool/die attach machine often cannot detect incorrect alignment relative to the wafer 102. Thus, the picking/die attach machine may slip one row and/or column, which may lead to low yield at a final test due to failed test dice being assembled at the die attach.

SUMMARY

Therefore, there is need for more reliably aligning a picking/die attach machine relative to a wafer, e.g., to reduce or substantially eliminate the likelihood of picking an incorrect die position on the wafer.

According to the teachings of this disclosure, an automated process may be provided in the die attach (D/A) machine software to create an indicator line prior to a normal pick, thus allowing the D/A machine to subsequently monitor itself.

In one embodiment, a method for providing alignment in a die picking process comprises aligning a semiconductor wafer based on a reference die, forming an indicator line relative to the reference die by picking a number of dice along a line extending across the wafer, and using the reference line to monitor a position of the picking machine relative to the wafer.

In another embodiment, a method of processing a wafer having an array of dice comprises a picking machine aligning a wafer based on a reference die, forming an indicator line relative to the reference die by picking a number of dice along a line extending across the wafer, picking a plurality of die from the wafer, and during the picking process, using the indicator line to verify the position of the picking machine relative to the wafer.

In another embodiment, a semiconductor wafer, comprising an array of dice, a reference die, and an indicator line extending relative to the reference die, the indicator line comprising a number of picked dice along a line extending across the wafer, wherein the indicator line is usable by a picking machine for position verification.

BRIEF DESCRIPTION OF THE FIGURES

Example embodiments are discussed below with reference to the drawings, in which:

FIGS. 2A1-2C2 illustrate a conventional picking process using a selected reference die for alignment;

FIGS. 3A1-3D2 illustrate an example process for D/A machine alignment and verification using a reference line, or "indicator line," according to one embodiment;

FIGS. 4A1-4C2 illustrate an example process for creating an indicator line, according to one embodiment;

FIG. 7 illustrates an example die attach (D/A) machine for processing wafers using any of the techniques disclosed herein, in particular, by employing wafermapping control process using a reference line for position verification and/or error detection, according to various embodiments;

FIGS. 9A1 and 9A2 illustrate a physical wafer and a corresponding wafer map, respectively, showing an example of an accurate pick by machine; and FIGS. 9B1 and 9B2 illustrate an example of an error during the pick process, according to an example embodiment.

DETAILED DESCRIPTION

According to the teachings of this disclosure, an indicator line is formed on the wafer and used for verification of pick position, which allows the D/A machine to verify the position of every row and column. For example, an automated process may be created within the D/A machine software to create the indicator line at the start of processing each wafer prior to the picking process, thereby allowing the D/A machine to monitor itself.

Use of the indicator line may ensure reliable and accurate pick of the wafer from the wafermap data. For example, the technique may provide a method of quickly detecting errors in wafermap-to-wafer alignment during the pick and place operation on D/A machines. It may improve quality by quickly alerting assembly operators to errors in wafermap-to-wafer alignment, which might result in the incorrect die being picked and assembled.

In some embodiments, the indicator line crosses the wafer reference die, which may ensure reliable orientation.

Figure 1:
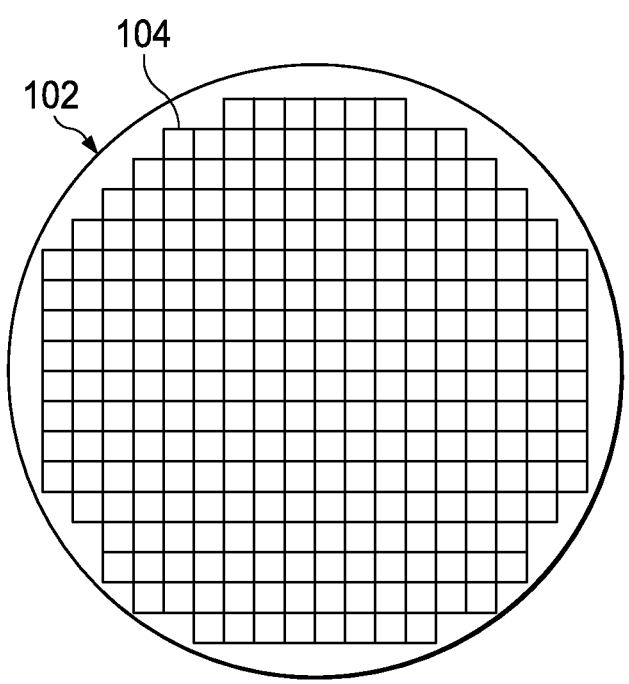
FIG. 1 illustrates a schematic plan view diagram of a semiconductor integrated circuit wafer comprising a plurality of semiconductor dice.

FIGS. 3A1-3D2 illustrate an example process for D/A machine alignment and verification using a reference line, or "indicator line," according to one embodiment. In particular, FIGS. 3A1-3D2 illustrate a physical wafer 102 and a corresponding wafer map 110 for four steps of the process. In a first step, illustrated by FIGS. 3A1 and 3A2, the wafer 102 is aligned using a selected reference die 105. For example, a user may select reference die 105B from available reference dice 105A and 105B pre-formed on the wafer 102. Next, as illustrated by FIGS. 3B1 and 3B2, the D/A machine creates an indicator line 120 on both the wafer 102 and wafer map 110, by picking a number of dice 104 along a straight line extending across the wafer.

In some embodiments, indicator line 120 may be formed by picking every die 104 along a line extending fully across wafer 102.

In other embodiments, indicator line 120 may be formed by picking at least about 50%, but not all, of the dice 104 along a line extending across wafer 102. For example, indicator line 120 may be formed by picking a consecutive row of dice 104 extending along a majority of a line extending across the wafer, or by picking dice 104 in an alternating manner along a line extending across the wafer, e.g., by picking every other die 104 along a line or along a substantial portion of a line extending across wafer 102.

In still other embodiments, indicator line 120 may be formed by picking between 25% and 50% of the dice 104 along a line extending across wafer 102. For example, indicator line 120 may be formed by picking dice 104 in an alternating manner along a line extending across the wafer, in a manner that picks a total of 25%-50% of the dice 104 along the line extending across wafer 102.

In still other embodiments, indicator line 120 may include two or more adjacent rows extending across wafer 102, with each row having all or some portion of the dice 104 picked according to any of the various embodiments discussed above. For example, indicator line 120 may be formed by picking every die 104 along a first row, and by picking dice in an alternating manner (e.g., every other die) along a second row adjacent the first, thereby forming a "jigsaw" shaped indicator line 120, e.g., as shown in the example embodiment discussed below.

In some embodiments, indicator line 120 may be formed such that it crosses the reference die 105 (e.g., selected reference die 105B). As used herein, "crossing" includes (a) two lines or segments fully crossing, (b) a first line or segment extending through an endpoint-die of a second line or segment, and (c) a first line or segment sharing an endpoint-die with a second line or segment. Thus, the crossing lines or segments share at least one die 104.

Next, as illustrated by FIGS. 3C1 and 3C2, the D/A machine begins picking up dice 104 from any position on the wafer 102. The picking process may continue until all or substantially all dice 104 on the wafer 102 are consumed, as shown in FIGS. 3D1 and 3D2. During the picking process, the D/A machine may use indicator line 120 for self-verification of the D/A machine position and wafermap-to-wafer alignment.

FIGS. 4A1-4C2 illustrate an example process for creation of the indicator line 120 (i.e., corresponding to the step shown in FIGS. 3B1 and 3B2 discussed above), according to one embodiment. In particular, FIGS. 4A1-4C2 illustrate a physical wafer 102 and a corresponding wafer map 110 for three steps of the process.

As shown in FIGS. 4A1 and 4A2, the creation of the indicator line 120 is started on the wafer 102 and wafermap 110, by picking dice 104 along one or more rows extending across the wafer 102. In this example, the creation of the indicator line 120 is started by picking dice 104 in an alternating manner along a first row. After completing the first row of indicator line 120, an adjacent second row of dice 104 is picked, as shown in FIGS. 4B1 and 4B2, thus forming indicator line 120 with a substantially zig-zag or saw toothed shape.

As shown in FIGS. 4C1 and 4C2, the indicator line 120 may be located such that it crosses the reference die 105B, which may provide reliable orientation. In the illustrated example, the second row of indicator line 120 shares the left-most die of the reference die 105B. In an alternative embodiment, the indicator line 102 may be spaced apart from the reference die 105B by one or more rows or columns.

Figure 5A:
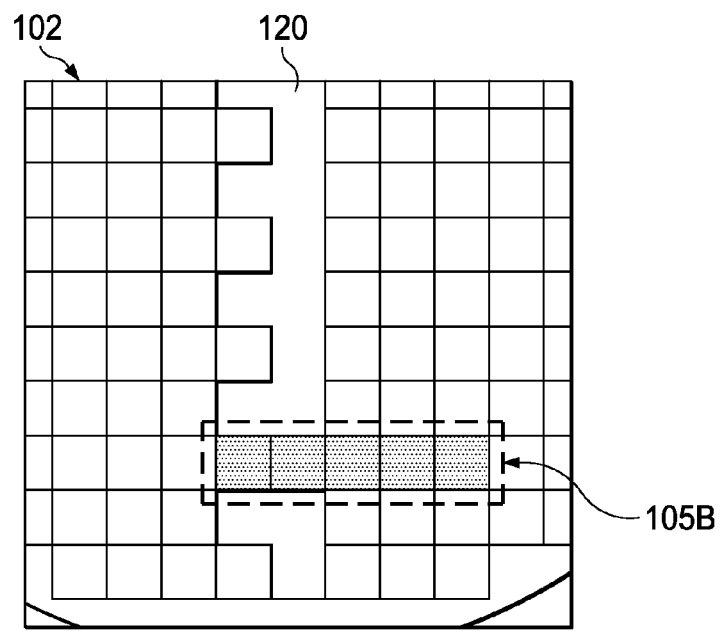
FIGS. 5A and 5B illustrate a physical wafer and a corresponding wafer map, respectively, showing an example indicator line having a zig-zag or saw tooth configuration, according to one embodiment.
Figure 5B:
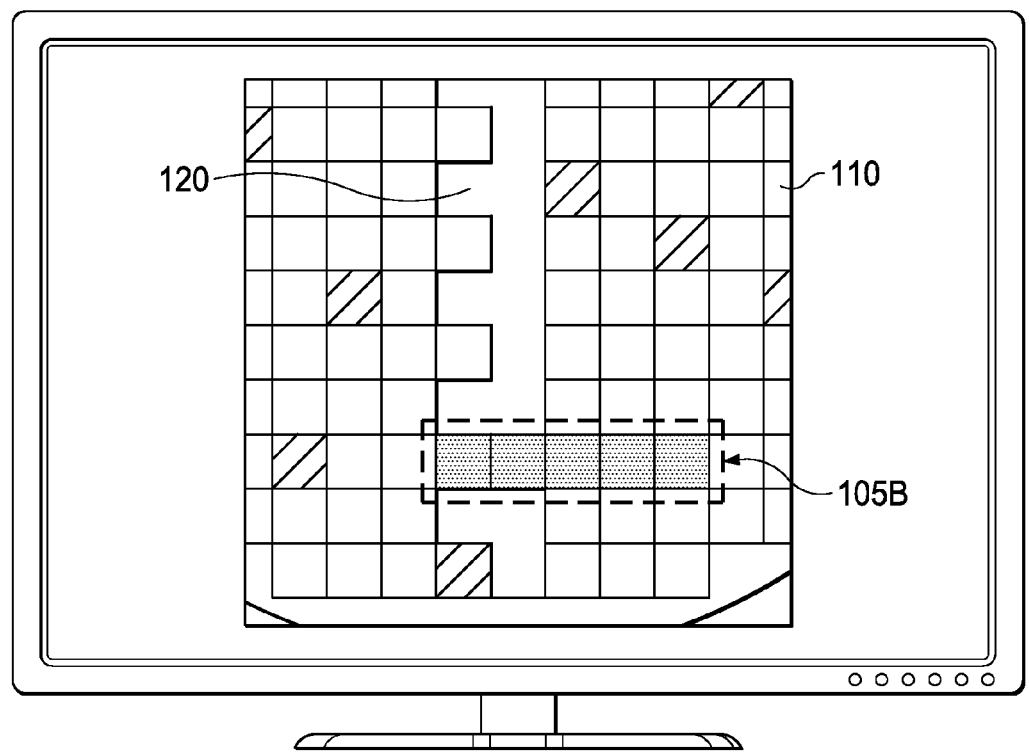

FIGS. 5A and 5B illustrate a physical wafer 102 and a corresponding wafer map 110, respectively, showing another indicator line 120 having a zig-zag or saw tooth configuration, similar to that shown in FIGS. 4C1 and 4C2. This configuration of the indicator line 120 may provide a further advantage over a straight single-row indictor line, in certain systems or situations. For example, the zig-zag or saw tooth configuration may provide additional error protection by detecting errors in both row and column locations.

Figure 6A:
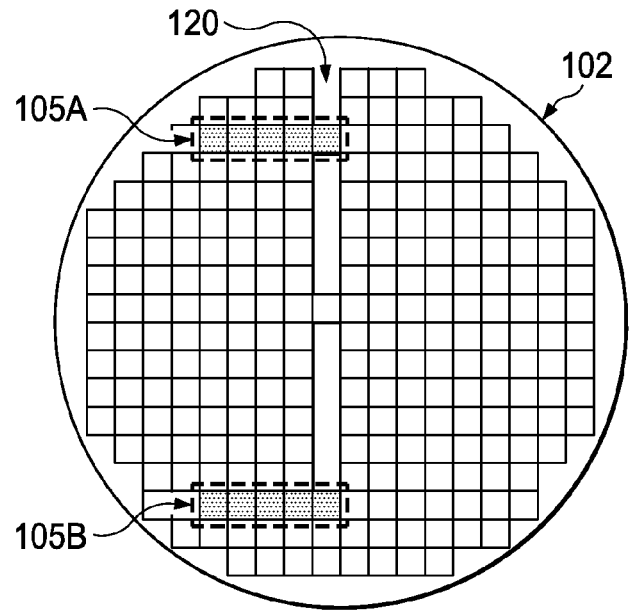
FIGS. 6A and 6B illustrate a physical wafer and a corresponding wafer map 110, respectively, showing an example single-row indictor line, according to one embodiment.
Figure 6B:
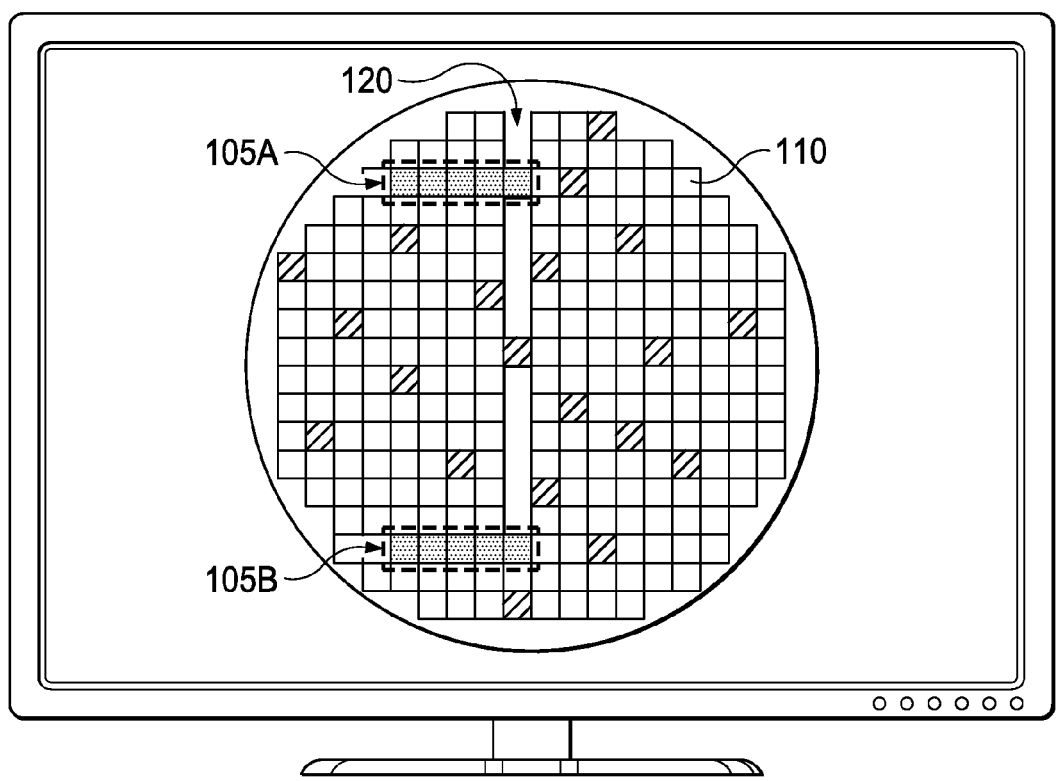

FIGS. 6A and 6B illustrate a physical wafer 102 and a corresponding wafer map 110, respectively, showing an example of a straight single-row indictor line 120.

FIG. 7 illustrates an example die attach (D/A) machine 150 for processing wafers, e.g., any of the wafers 102 discussed above, using any of the techniques disclosed herein, in particular, by employing wafermapping control process using a reference line for position verification and/or error detection, as disclosed herein. D/A machine 150 may include a control system 152 configured to control a picking device or apparatus 154 for picking dice from a wafer 102. Control system 152 may include any suitable hardware and/or software for performing control operations for D/A machine 150, including picking, position verification, and error detection functions. For example, as shown, control system 152 may include a processor 160 and non-transitory memory 162 storing (a) software or other computer-readable logic or instructions 164 for performing any of the functionality disclosed herein, e.g., the method discussed below with respect to FIG. 8, and (b) one or more wafermaps 110. Non-transitory memory 162 may include any suitable memory device or devices, e.g., register memory, processor cache, magnetic memory, Random Access Memory (RAM), any type of Read Only Memory (ROMs), flash memory, disks, etc. Non-transitory memory 162 may also include one or more databases. Alternatively, some or all of the functionality disclosed herein may be provided by firmware of control system 152.

Figure 8:
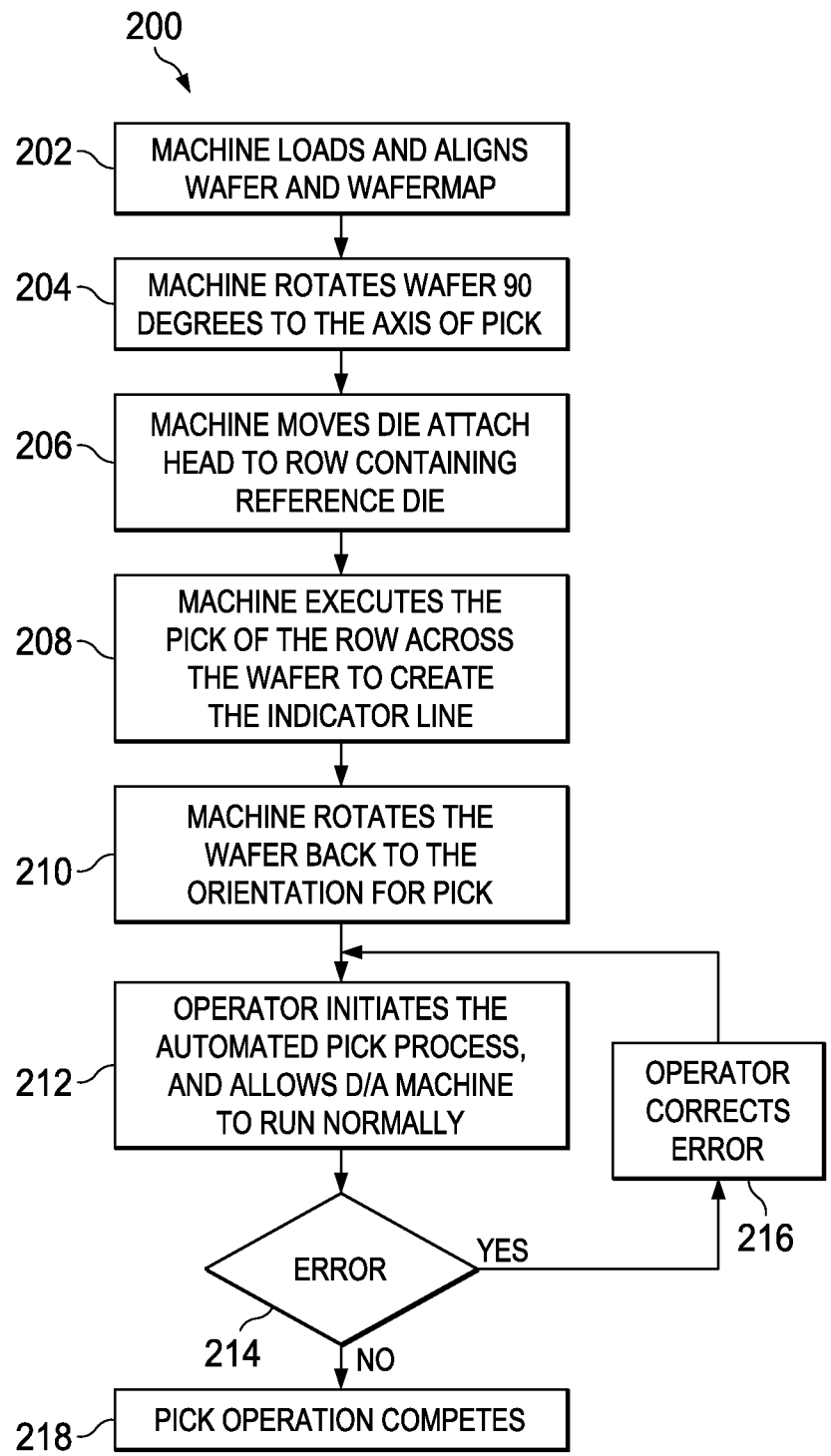
FIG. 8 illustrates an example wafermapping control method, which may be embodied in software/logic of a control system, according to one embodiment.

FIG. 8 illustrates an example wafermapping control method 200, which may be embodied in software/logic 164 of control system 152, according to one embodiment. At step 202, the D/A machine 150 loads and aligns the wafer 102 and wafermap 110. At step 204, machine 150 then rotates the wafer 90 degrees to the picking axis. At step 206, machine 150 moves a die attach head 154 to the row containing a reference die 105 (which may be user-selected from multiple available reference dice). At step 208, machine 150 then executes a full or partial pick of one or more rows extending across the wafer 102 to create an indicator line 120, e.g., as discussed above.

At step 210, machine 150 then rotates the wafer 120 back to a picking orientation. At step 212, an operator may then initiate an automated pick process, wherein D/A machine 150 runs normally, and may perform self-verification of the machine's position at suitable times (e.g., at regular intervals, after every row or column, after picking a predefined number of dice, etc.). During the automated pick process, wherein D/A machine 150 moves perpendicular to the elongated direction of the indicator line 120, such that the machine 150 passes the indicator line 120 on each pass. For example, with reference to FIGS. 3B1-3C2, the pick machine 150 moves horizontally to pick each horizontal row, and thus passes the vertically-oriented indicator line 120 on each horizontal pass. Thus, machine 150 may verify the position of the machine relative to the wafer on each horizontal pass, by comparing the position of the actual dice in each row of the wafer 102 with the wafer map 110.

At step 214, machine 150 may detect an error. For example, machine 150 may determine that there is no actual die at a position where the wafer map indicates a die is present, or vice versa, which may indicate that the actual machine position is one (or more) die offset from the position indicated by the wafer map. When an error is detected, machine 150 may generate and display an error signal to the operator and the operator may correct the errors as appropriate, as indicated at 216. For example, machine 150 may generate a pop-up indicating the presence of an error, and may further provide details of the error. The software may then prompt the user to verify the error and/or perform a correction of the die position at the actual wafer. After correcting the error, the pick operation may continue in this manner until completion, as indicated at 218.

FIGS. 9A1 and 9A2 illustrate a physical wafer 102 and a corresponding wafer map 110, respectively, showing an example of an accurate pick by machine 150, while FIGS. 9B1 and 9B2 illustrate an example of an error during the pick process. As shown in FIGS. 9A1 and 9A2, the die pattern of the wafer 102 being picked matches the wafer map 110. In contrast, in FIGS. 9B1 and 9B2, the die pattern of the wafer 102 being picked does not match the wafer map 110. In particular, machine 150 detects that for a particular die position 104A, there is no die on the wafer, while the wafer map 110 indicates that a die should be present. Thus, machine 150 may determine that the actual position of machine 150 is offset from the position indicated by the wafer map by one or more dice. In response, machine 150 may generate a pop-up 220 indicating the presence of an error, and may further provide details of the error. In some embodiments, machine 150 will stop on every row where an error is detected, and only proceed to pick the next row after some predefined user interaction, e.g., to correct the alignment error. In other embodiments, machine 150 may continue to pick the full wafer even after detecting error(s), and then generate an error report for the user.

Although the disclosed embodiments are described in detail in the present disclosure, it should be understood that various changes, substitutions and alterations can be made to the embodiments without departing from their spirit and scope.

What is claimed is:

1. A method for providing alignment in a die picking process, comprising:
   aligning a semiconductor wafer based on a reference die;
   forming an indicator line prior to picking a die, the indicator line formed relative to the reference die by picking a number of dice along a line extending across the wafer; and
   using the indicator line to monitor a position of the picking machine relative to the wafer.

2. The method according to claim 1, comprising forming the indicator line such that it crosses the reference die.

3. The method according to claim 1, wherein forming the indicator line comprises picking every die along the line extending across the wafer.

4. The method according to claim 1, wherein forming the indicator line comprises picking only some of the dice along the line extending across the wafer.

5. The method according to claim 1, wherein forming the indicator line comprises picking most, but not all, of the dice along the line extending across the wafer.

6. The method according to claim 1, wherein forming the indicator line comprises picking dice in an alternating manner along the line extending across the wafer.

7. The method according to claim 1, wherein forming the indicator line comprises picking every other die along the line extending across the wafer.

8. The method according to claim 1, wherein forming the indicator line comprises forming a zig-zag or saw tooth shape by picking all or substantially all of the dice along a first line extending across the wafer, and picking dice in an alternating manner along a second line adjacent and parallel to the first line.

9. The method according to claim 1, wherein the reference die comprises multiple individual dice of the wafer.

10. A method of processing a wafer having an array of dice, comprising:
    a picking machine aligning a wafer based on a reference die;
    the picking machine forming an indicator line prior to picking a die, the indicator line formed relative to the reference die by picking a number of dice along a line extending across the wafer;

the picking machine picking a plurality of dice from the wafer; and during the picking process, the picking machine using the indicator line to verify the position of the picking machine relative to the wafer.

11. The method according to claim 10, further comprising the picking machine identifying a map location error, and indicating the error to an operator.

12. The method according to claim 10, comprising forming the indicator line such that it crosses the reference die.

13. The method according to claim 10, wherein forming the indicator line comprises forming a zig-zag or saw tooth shape by picking all or substantially all of the dice along a first line extending across the wafer, and picking dice in an alternating manner along a second line adjacent and parallel to the first line.

14. The method according to claim 10, wherein the reference die comprises multiple individual dice of the wafer.

* * * * *